United States Patent
Nakase et al.

(10) Patent No.: US 9,252,772 B2
(45) Date of Patent: Feb. 2, 2016

(54) MULTI DIRECTION SWITCH HAVING DETECTING MECHANISM

(71) Applicant: HON HAI PRECISION INDUSTRY CO., LTD., New Taipei (TW)

(72) Inventors: Yusho Nakase, Yokohama (JP); Wei-Ping Liu, Shenzhen (CN); Liang Sun, Shenzhen (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 176 days.

(21) Appl. No.: 14/162,772

(22) Filed: Jan. 24, 2014

(65) Prior Publication Data

US 2014/0216912 A1 Aug. 7, 2014

(30) Foreign Application Priority Data

Feb. 5, 2013 (CN) .......................... 2013 1 0044462

(51) Int. Cl.
*H01H 15/10* (2006.01)
*H03K 17/965* (2006.01)
*H01H 25/00* (2006.01)

(52) U.S. Cl.
CPC ............ *H03K 17/965* (2013.01); *H01H 25/008* (2013.01)

(58) Field of Classification Search
CPC ............................. H01H 15/10; H01H 25/008
USPC ........................................................ 200/547
See application file for complete search history.

(56) References Cited

U.S. PATENT DOCUMENTS

| | | | | |
|---|---|---|---|---|
| 6,528,740 B2* | 3/2003 | Miyoshi | .............. | G06F 3/03548 200/18 |
| 7,102,088 B2* | 9/2006 | Tan | ....... | H01H 25/041 200/5 A |
| 7,310,083 B2* | 12/2007 | Hagiwara | ........... | G06F 3/03548 200/5 R |
| 7,439,461 B2* | 10/2008 | Sawada | ..................... | G05G 5/05 200/4 |
| 7,459,646 B1 | 12/2008 | Shi | | |
| 2014/0054153 A1* | 2/2014 | Nakase | ................... | H01H 3/38 200/5 R |

FOREIGN PATENT DOCUMENTS

| | | |
|---|---|---|
| CN | 1577676 A | 2/2005 |
| JP | 2006-107336 | 4/2006 |
| JP | 3814279 | 6/2006 |
| JP | 3814280 | 6/2006 |
| JP | 2011-233435 | 11/2011 |
| WO | 2011-064653 | 6/2011 |

* cited by examiner

*Primary Examiner* — Kyung Lee
(74) *Attorney, Agent, or Firm* — Wei Te Chung; Ming Chieh Chang (57) ABSTRACT

A multi direction switch (100) includes a first cover (31) having a first static detecting mechanism (3132), a second cover (32) having a second static detecting mechanism (3232), a first moving body (51) having a first movable detecting mechanism (513), a second moving body (52) having a second movable detecting mechanism (523), and an actuating mechanism. The second movable detecting mechanism is movable relative to the second static detecting mechanism in response to a movement of the second moving body along a first direction. The first movable detecting mechanism is movable relative to the first static detecting mechanism in response to a movement of said first moving body along a second direction perpendicular to the first direction.

16 Claims, 9 Drawing Sheets

MULTI DIRECTION SWITCH HAVING DETECTING MECHANISM

BACKGROUND OF THE INVENTION

1. Field of the Invention

The present invention relates generally to a multi direction, and more particularly to a multi direction switch having detecting mechanism capable of transmitting different signals denoting multi positions.

2. Description of Related Arts

A multi direction switch is widely used in an electronic appliance for denoting multi positions when the electronic appliance is in use. Japanese Patent Application Pub. No. 2011-233435 discloses a conventional multi direction switch. The multi direction switch has a button for actuating two moving plates thereof and a helical spring member assembled to the button for returning the button to its initial position. The multi direction switch is divided into two stacked upper and lower cavities by forming a block portion between a top cover and a bottom cover. The resilient spring member is positioned in the upper cavity above the block portion. The two moving plates are positioned in the lower cavity below the block portion. The button comprises an operation portion extending out of the top cover, a widened radial portion in the upper cavity, and a narrowed actuating portion in the lower cavity. Therefore, the two moving plates are respectively actuated by the actuating portion to move on two static portions in two circuits formed on one printed circuit board along two ordigonal directions for generating different signals. The radial portion of the button extends inside the spring member for deflecting the spring member. Both the top cover and the block portion have ribs for confining the spring member. A gap is defined between the top cover rib and the block portion rib so that the widened radial portion can extend into and interact with the spring member.

Two static portions contactable with the two moving plates are formed and on one printed circuit board. The two circuits connected with the two static portions may be wrongly conducted since they are distributed in a same printed circuit board. In addition, a restoring force provided by the spring member is exerted to the button firstly and to drive the moving plates nextly.

An improved multi direction switch having two static portions formed on two elements is desired.

SUMMARY OF THE INVENTION

Accordingly, an object of the present invention is to provide a multi direction switch including two static static detecting mechanism formed on a first cover and a second cover.

To achieve the above object, a multi direction switch includes a first cover having a first static detecting mechanism, a second cover having a second static detecting mechanism, a first moving body having a first movable detecting mechanism, a second moving body having a second movable detecting mechanism, and an actuating mechanism. The second movable detecting mechanism is movable relative to the second static detecting mechanism in response to a movement of the second moving body along a first direction. The first movable detecting mechanism is movable relative to the first static detecting mechanism in response to a movement of said first moving body along a second direction perpendicular to the first direction.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1 to 9, a multi direction switch 100 of the present invention comprises a first cover 31, a second cover 32 attached to the first cover 31 to have a receiving space 310 defined therebetween, a pair of stacked moving bodies 51, 52 received in the receiving space 310, an actuating mechanism (not labeled) assembled to the pair of moving bodies 51, 52, a gasket 4 defining a circular hole 41, and an elastic mechanism 6 assembled around a periphery of the pair of moving bodies 51, 52. The elastic mechanism 6 is formed into a helical spring 6 in this embodiment and could be formed into other elastic member.

Figure 1:
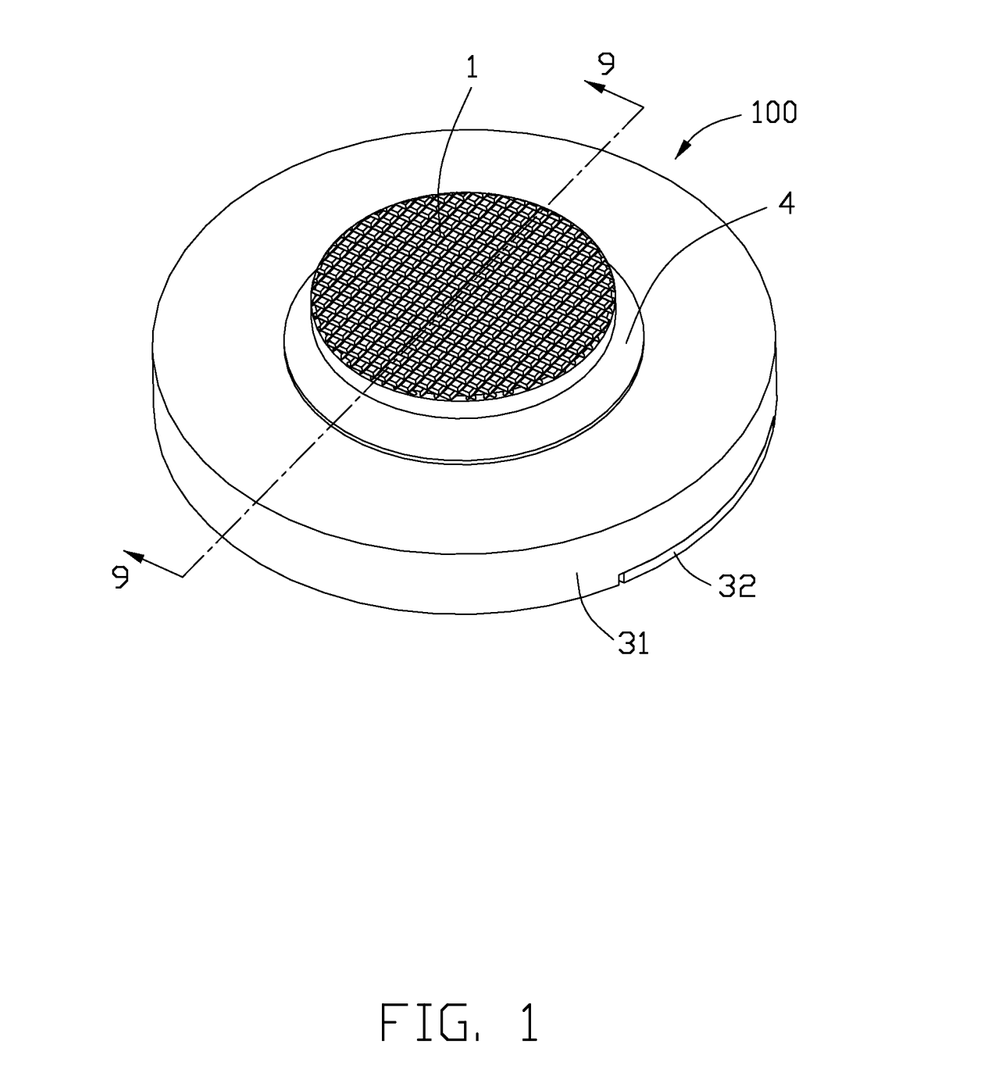
FIG. 1 is a perspective, assembled view of a multi direction switch of the present invention.
Figure 2:
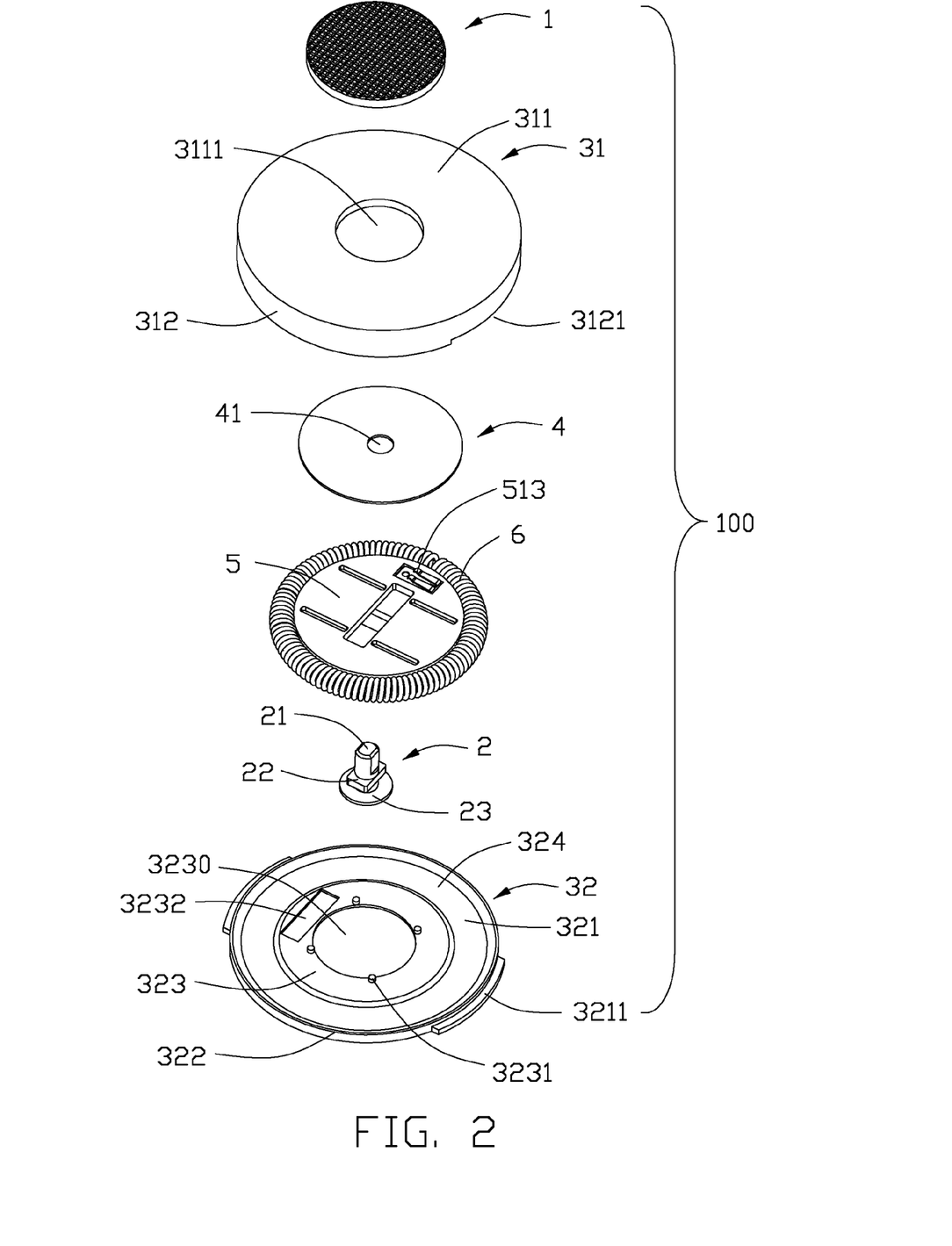
FIG. 2 is an exploded perspective view of the multi direction switch.
Figure 3:
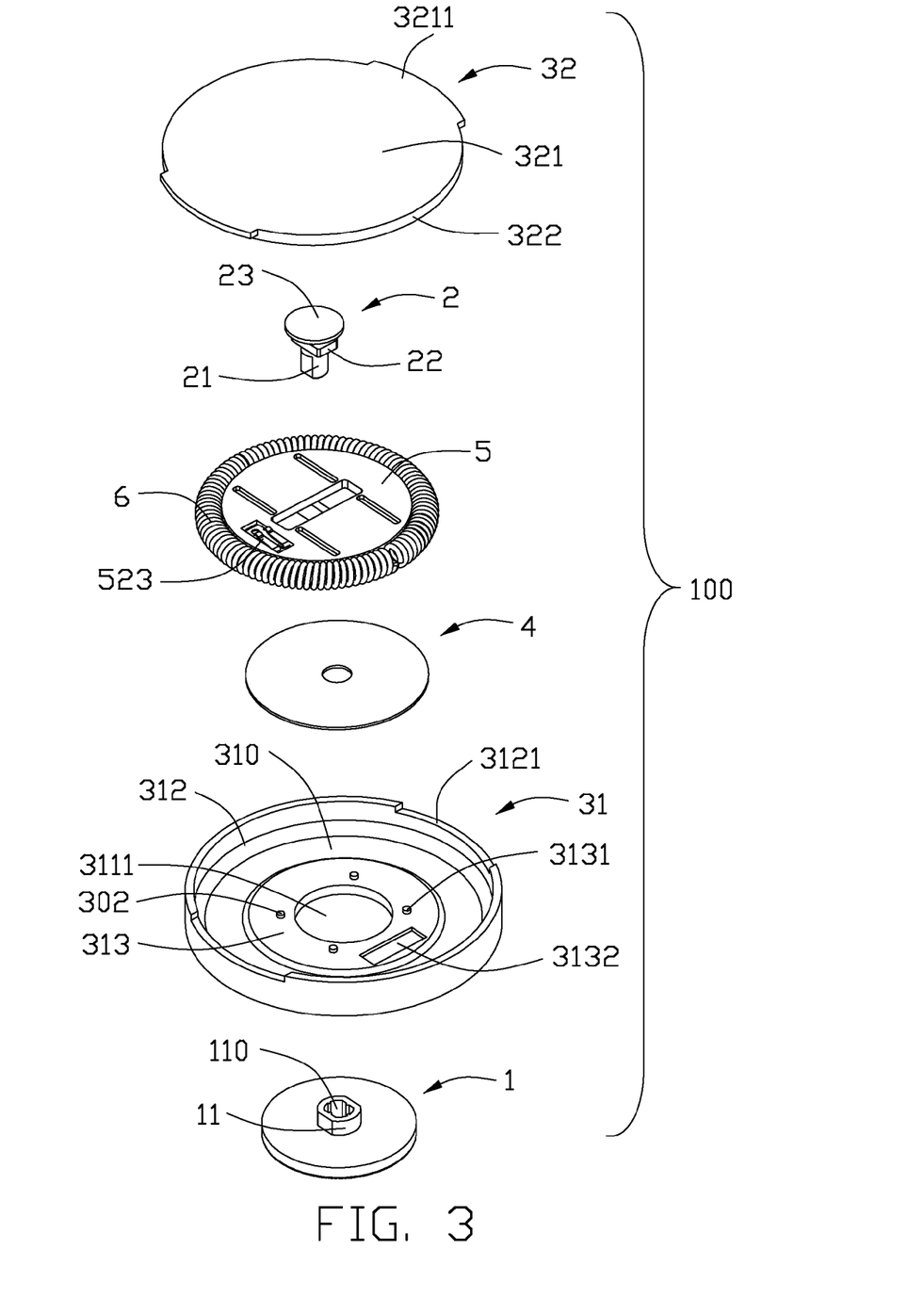
FIG. 3 is another exploded view similar to FIG. 2, taken from another aspect.
Figure 4:
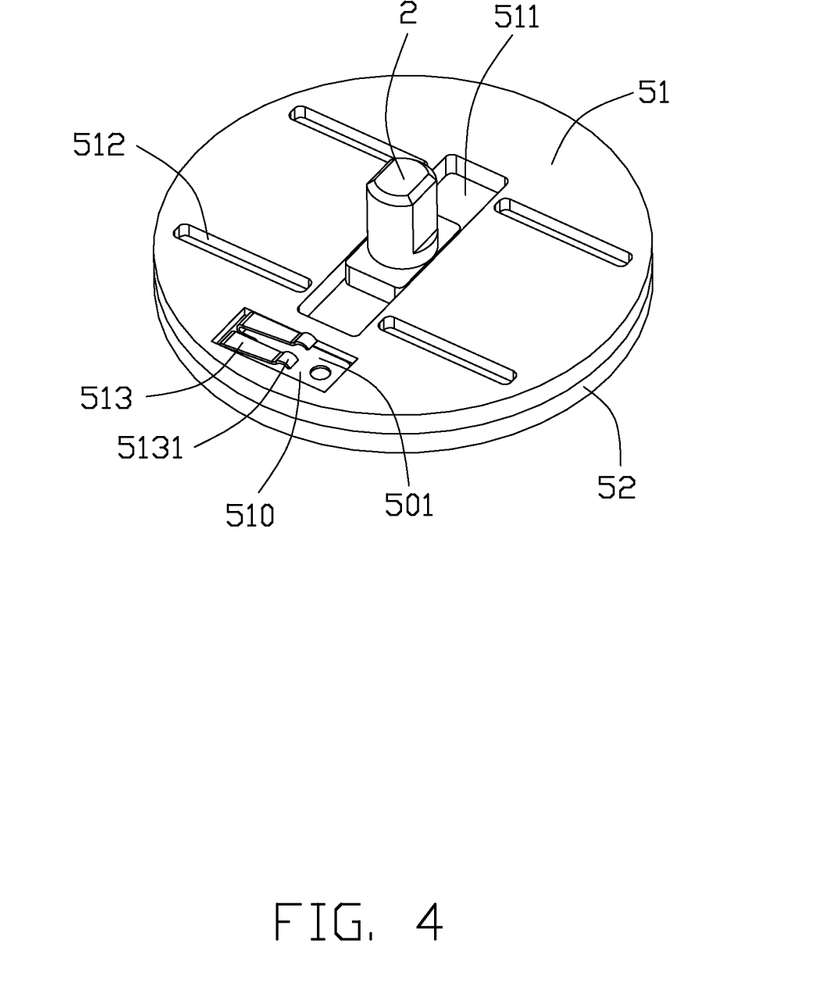
FIG. 4 is a perspective view showing an operator assembled to a first moving body and a second moving body.
Figure 5:
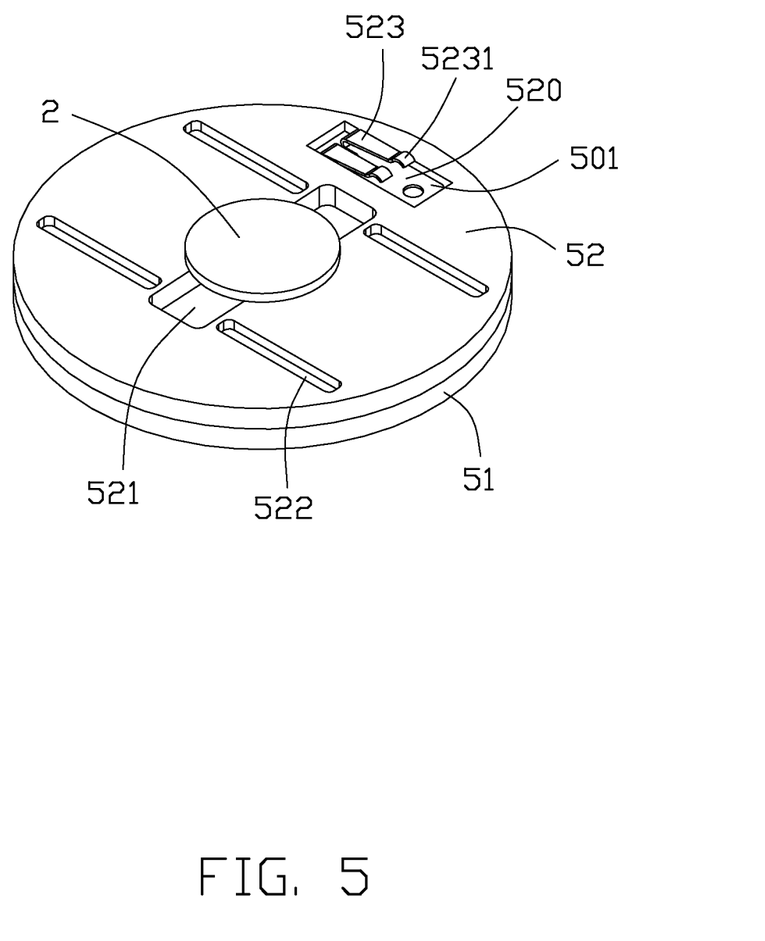
FIG. 5 is another perspective view similar to FIG. 4, taken from another aspect.
Figure 6:
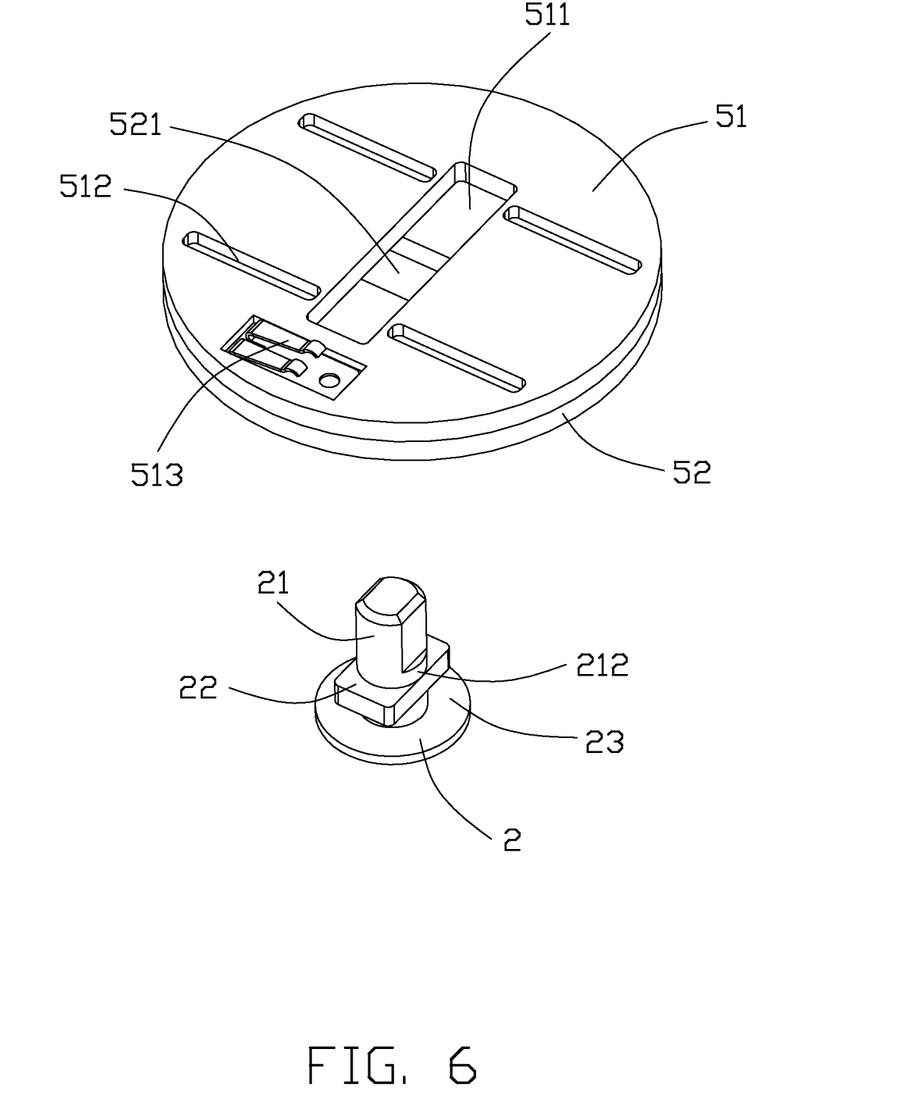
FIG. 6 is a perspective view showing the operator separated from the first moving body and the second moving body.

Referring to FIGS. 2 and 3, the first cover 31 includes a circular top wall 311 defining an inserting hole 3111, a side wall 312 extending downwardly from a periphery of the top wall 311. The side wall 312 defines a pair of cutouts 3121. The first cover 31 comprises a maintaining portion 313, a plurality of first protrusions 3131 and a first static detecting mechanism 3132 formed on the maintaining portion 313. In this embodiment, the first static detecting mechanism 3132 is formed into a first conductive plate 3132.

The second cover 32 includes a circular bottom wall 321, a periphery wall 322 extending upwardly from a periphery of the bottom wall 321, and a groove 324 outside of the supporting portion 323 for confining the helical spring 6. The periphery wall 322 is formed with a pair of abutting portions 3211. The second cover 32 comprises a supporting portion 323 and a recess 3230 surrounded by the supporting portion 323, a plurality of second protrusions 3231 and a second static detecting mechanism 3232 formed on the supporting portion 323. The second static detecting mechanism 3232 is formed into a second conductive plate 3132.

Figure 7:
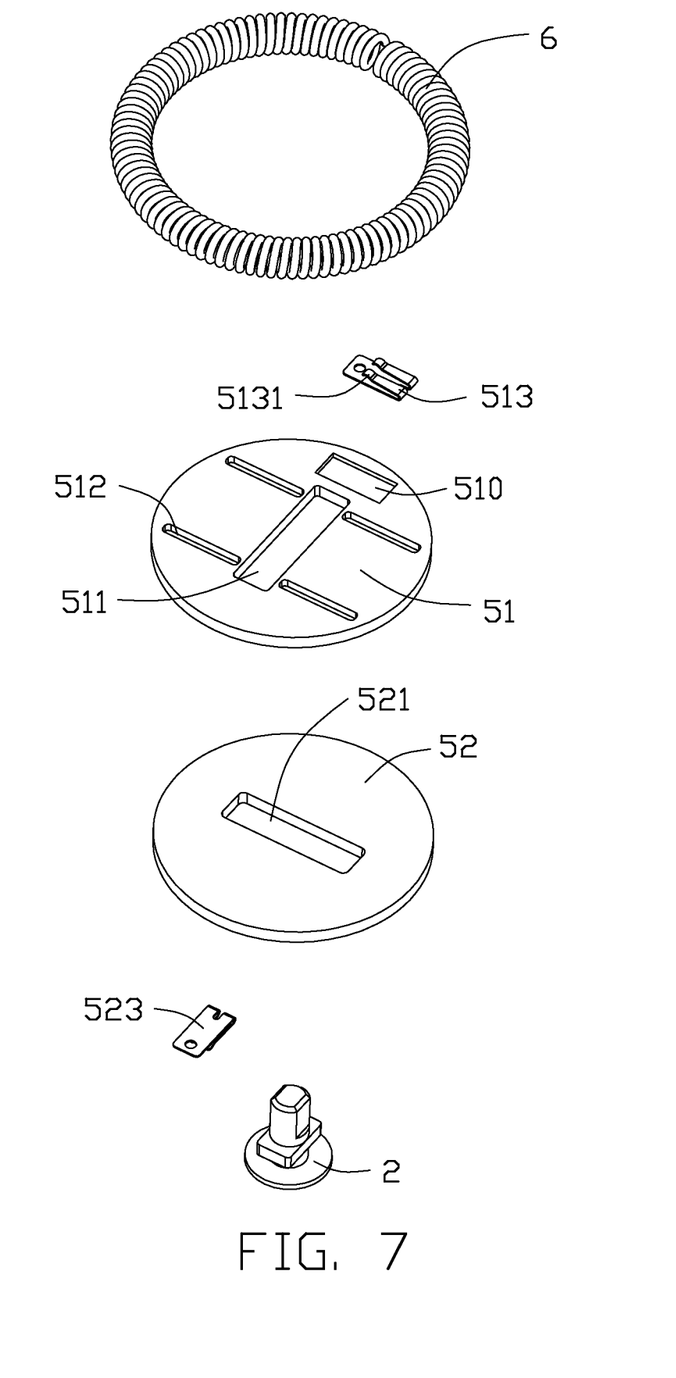
FIG. 7 is an exploded view showing the multi direction switch, with a first cover, a second cover and an actuator being removed.
Figure 8:
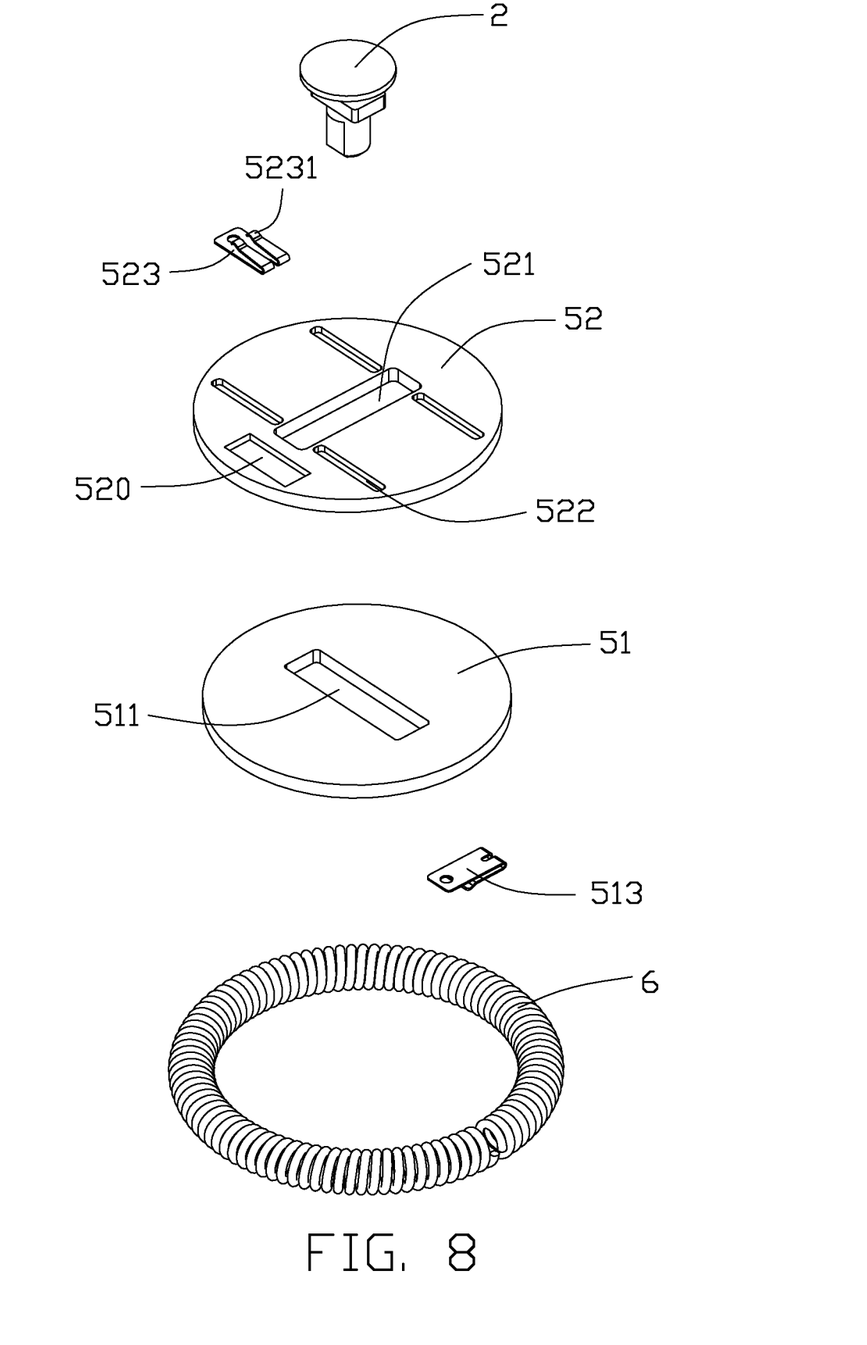
FIG. 8 is another exploded perspective view similar to FIG. 7, taken from another aspect.

Referring to FIGS. 7-8, a pair of stacked moving bodies 51, 52 include a first moving body 51 and a second moving body 52. The first moving body 51 defines a first slot 511 extending along a first direction, a plurality of first slits 512 extending along a second direction perpendicular to the first direction. The first moving body 51 has a first movable detecting mechanism 513 formed thereon. In this embodiment, the first movable detecting mechanism 513 is formed into a first terminal group 513 including a plurality of terminals 5131 received in an indentation 510 defined in the first moving body 51.

The second moving body 52 defines a second slot 521 extending along the second direction, a plurality of second slits 522 extending along the first direction. The second moving body 52 has a second movable detecting mechanism 523 formed thereon. In this embodiment, the second movable detecting mechanism 523 is formed into a first terminal group 523 including a plurality of terminals 5231 received in an indentation 520 defined in the second moving body 52.

The actuating mechanism comprises an operator 2 and an actuator 1 mounted on the operator 2. Referring to FIG. 2, the operator 2 has a base portion 23, a button 21 standing on the base portion 23 and having an engaging portion 212 engaging with the circular hole 41 of the gasket 4, and a pair of wings 22 extending along the first direction from the button 21 and separated from the base portion 23. The actuator 1 comprises a mounting post 11 defining a mounting hole 110 therein.

Figure 9:
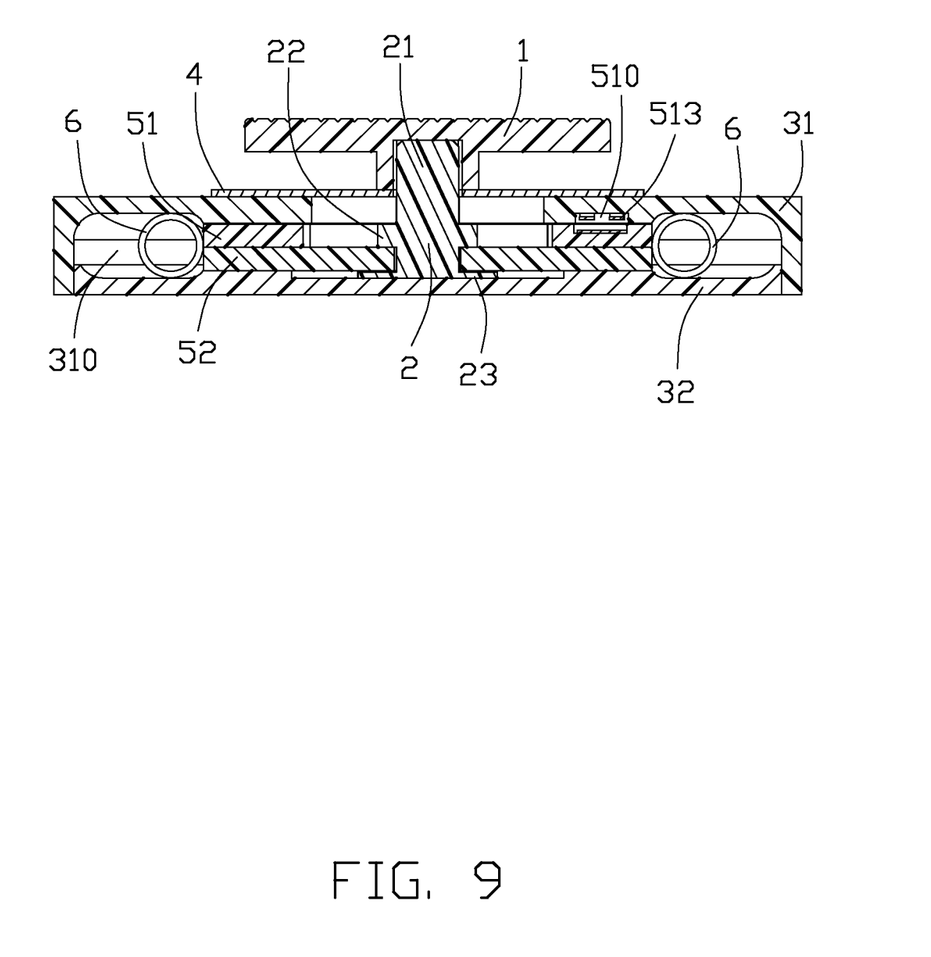
FIG. 9 is a cross-sectional view of the multi direction switch taken from line 9-9 in FIG. 1.

Referring to FIGS. 1-9, in assembling of the multi direction switch 100, the first moving body 51 is stacked on the second moving body 52. The helical spring 6 is assembled around a periphery of the first moving body 51 and a periphery of the second moving body 52. The button 21 of the operator 2 is upwardly inserted through the second slot 521 and the first slot 511 in sequence, with the pair of wings 22 received in the first slot 511. The pair of moving bodies 51, 52, the helical spring 6, and the operator 2 are positioned in the second cover 32. As shown in FIG. 9, the recess 3230 has a depth substantially same to a thickness of the base portion 23 to make an upper surface of the base portion 23 flush with that of the supporting portion 323 for supporting the second moving body 52. The wings 22 has a thickness substantially same to that of the first moving body 51. The second moving body 52 is partially sandwiched between the base portion 23 and the wings 22 of the operator 2 along a top-to-bottom direction. The helical spring 6 is received in the groove 324.

The first cover 31 is mounted on the second cover 32, with the abutting portions 3211 latching with the cutouts 3121. The gasket 4 is attached to the upper side of the first cover 31, and supported by the top wall 311. The button 21 is inserted outwardly from the inserting hole 3111 of the first cover 31 and the circular hole 41 of the gasket 4 in sequence. The actuator 1 is attached to the operator 2. The button 21 is received in the mounting hole 110 of the actuator 1.

When the button 21 is driven by the actuator 1 and slides along the second slot 521 from an initial position to two final positions, i.e., opposite ends of the second slot 521, the first moving body 51 moves along the second direction. Therefore, the first terminal group 513 slides along the first conductive plate 3132 to two different positions, to result in impedance change in a circuit embedded in the first cover 31, to thereby generate different electrical signals for detecting purpose. The first protrusions 3131 slide along the first slits 512 for guaranteeing the movement of the first moving body 51 along the predetermined track.

When the button 21 is driven by the actuator 1 and slides along the first slot 511 from the initial position to two ultimate positions, i.e., opposite ends of the first slot 511, the second moving body 52 moves along the first direction. Therefore, the second terminal group 523 slides along the second conductive plate 3232 to two different positions, to result in impedance change in a circuit embedded in the second cover 32, to thereby generate another two different electrical signals for detecting purpose. The second protrusions 3231 slide along the second slits 522 for guaranteeing the movement of the second moving body 52 along the predetermined track. The base portion 23 of the operator 2 moves within the recess 3230.

The first static static detecting mechanism 3132 and the second static static detecting mechanism 3232 are respectively formed on the first cover 31 and the second cover 32. Two circuits (not shown) connected with the first static static detecting mechanim 3132 and the second static static detecting mechanim 3232 to generate different electrical signals according to different impedance are respectively distributed in the first cover 31 and the second cover 32, and are therefore hard to be wrongly conducted. In addition, the helical spring 6 is assembled to a periphery of the first moving body 51 and a periphery of the second moving body 52. The pair of moving bodies 51, 52 are exerted by a restoring force from the helical spring 6 directly and take a restoring movement smartly.

The first static detecting mechanism 3132 and the second static detecting mechanism 3232 could be named into a static detecting mechanism. The first movable static detecting mechanism 513 and the second movable static detecting mechanism 523 could be named into a movable detecting mechanism.

In another embodiment, the first static detecting mechanism 3132 could be formed into a first terminal group, while the first movable static detecting mechanism 513 could be formed into a first conducting plate. The second static detecting mechanism 3232 could be formed into a second terminal group, while the second movable static detecting mechanism 523 could be formed into a second conducting plate.

Optionally, the first protrusions 3131 are formed on the first moving body 51, while the first slits 512 are defined on the first cover 31. The second protrusions 3231 are formed on the second moving body 52, while the second slits 522 are defined on the second cover 32.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A multi direction switch comprising:
    a first cover and a second cover attached to the first cover to have a receiving space therebetween, the first cover having a first static detecting mechanism formed thereon, the second cover having a second static detecting mechanism formed thereon;
    a first moving body received in the receiving space and having a first movable detecting mechanism formed thereon, and a second moving body received in the receiving space and having a second movable detecting mechanism formed thereon; and
    an actuating mechanism assembled to and driving the first moving body and the second moving body,
    said second movable detecting mechanism being movable relative to the second static detecting mechanism in response to a movement of said second moving body along a first direction,
    said first movable detecting mechanism being movable relative to the first static detecting mechanism in response to a movement of said first moving body along a second direction perpendicular to the first direction.

2. The multi direction switch as claimed in claim 1, further comprising an elastic mechanism assembled around both a periphery of the first moving body and a periphery of the second moving body.

3. The multi direction switch as claimed in claim 2, wherein said first moving body defines a first slot extending along the first direction, the actuating mechanism being movable in the first slot to slide said second movable detecting mechanism relative to the second static detecting mechanism from an initial position to two ultimate positions to detect different movements of the second moving body, and the second moving body defines a second slot extending along the second direction, the actuating mechanism being movable in the second slot to slide said first movable detecting mechanism relative to the first static detecting mechanism, from the initial position to two final positions to detect different movements of the first moving body.

4. The multi direction switch as claimed in claim 3, wherein said actuating mechanism comprises an operator having a button inserted through the first and second slots, said button being slidable along the second slot toward opposite ends of the second slot to drive the first moving body toward the two final positions, said button being slidable along the first slot toward opposite ends of the first slot to drive the second moving body toward the two ultimate positions.

5. The multi direction switch as claimed in claim 4, further comprises a gasket, and wherein said actuating mechanism comprises an actuator mounted on the operator, said gasket being disposed between the first cover and the actuator.

6. The multi direction switch as claimed in claim 3, wherein one of said first moving body and the first cover defines a plurality of first slits each extending along the second direction, and the other of said first moving body and the first cover defines a plurality of first protrusions slidable in the first slits, one of said second moving body and the second cover defines a plurality of second slits each extending along the first direction, and the other of said second moving body and the second cover defines a plurality of second protrusions slidable in the second slits.

7. The multi direction switch as claimed in claim 3, wherein said operator includes a pair of wings extending along the first direction and received in the first slot.

8. The multi direction switch as claimed in claim 7, wherein said operator includes a base portion formed at a bottom of the button, said second cover has a supporting portion and a recess receiving the base portion, and said recess has a depth substantially same to a thickness of the base portion to make an upper surface of the base portion flush with that of the supporting portion for supporting the second moving body.

9. The multi direction switch as claimed in claim 8, wherein said second moving body is partially sandwiched between the base portion and the wings along a top-to-bottom direction.

10. The multi direction switch as claimed in claim 8, wherein said second cover defines a groove outside of the supporting portion for confining the elastic mechanism.

11. The multi direction switch as claimed in claim 1, wherein one of static detecting mechanism and the movable detecting mechanism is formed into a conductive plate, and the other of static detecting mechanism and the movable detecting mechanism is formed into a terminal group slidable in the conductive plate.

12. The multi direction switch as claimed in claim 1, wherein said elastic mechanism is formed into a helical spring and is partially compressed and partially stretched along with the movement of the actuating mechanism.

13. A multi direction switch comprising:

opposite upper and bottom covers commonly defining a space therebetween;

first and second confining structure formed on inner surfaces of said upper and bottom covers;

an elastic ring positioned in the space with opposite inner and outer boundaries wherein the inner boundary is inwardly radially restricted by the first confining structure; and oppositely stacked upper and lower moving bodies commonly disposed in the space and snugly surrounded by the elastic ring so as to be in a resiliently restrained manner; wherein the upper moving body is linearly restricted by the second confining structure of the upper cover, and the lower moving body is linearly restricted by the second confining structure.

14. The multi direction switch as claimed in claim 13, wherein the stacked upper and lower moving bodies are actuated by an operator.

15. The multi direction switch as claimed in claim 13, wherein said elastic ring is urged by the upper and lower moving bodies respectively and independently.

16. The multi direction switch as claimed in claim 13, wherein each of said upper and lower moving bodies is equipped with a detecting mechanism.

\* \* \* \* \*